United States Patent
Blaum et al.

(10) Patent No.: US 7,126,502 B2
(45) Date of Patent: Oct. 24, 2006

(54) TECHNIQUES FOR USING INTERLEAVED ENCODERS TO OBTAIN MODULATION CONSTRAINTS

(75) Inventors: Mario Blaum, San Jose, CA (US); Ksenija Lakovic, San Jose, CA (US); Bruce A. Wilson, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/049,403

(22) Filed: Feb. 1, 2005

(65) Prior Publication Data

US 2006/0170577 A1 Aug. 3, 2006

(51) Int. Cl.
H03M 7/00 (2006.01)

(52) U.S. Cl. .............................. 341/58; 341/59; 341/81

(58) Field of Classification Search .................. 341/58, 341/59, 80, 81; 360/40, 48; 369/59.32, 369/59.24; 714/701, 769–771, 791–796
See application file for complete search history.

(56) References Cited

U.S. PATENT DOCUMENTS

| | | | |
|---|---|---|---|
| 4,707,681 A | 11/1987 | Eggenberger et al. | |
| 4,818,969 A | 4/1989 | Krakauer et al. | |
| 5,241,309 A | 8/1993 | Cideciyan et al. | |
| 5,311,521 A | 5/1994 | Fitingof et al. | |
| 5,757,294 A | 5/1998 | Fisher et al. | |
| 5,757,822 A | 5/1998 | Fisher et al. | |
| 5,760,718 A | 6/1998 | Schouhamer Immink | |
| 5,859,600 A * | 1/1999 | Nozawa | 341/59 |
| 6,018,304 A | 1/2000 | Bessios | |
| 6,072,410 A * | 6/2000 | Kim | 341/81 |
| 6,081,210 A * | 6/2000 | Nikolic et al. | 341/59 |
| 6,236,340 B1 | 5/2001 | Patapoutian et al. | |
| 6,388,587 B1 * | 5/2002 | Brickner et al. | 341/59 |
| 6,417,788 B1 | 7/2002 | McEwen et al. | |
| 6,557,124 B1 | 4/2003 | Cideciyan et al. | |
| 2004/0093554 A1* | 5/2004 | Hung | 714/801 |

OTHER PUBLICATIONS

J.D. Coker et al., "Implementation of PRML in a rigid disk drive", IEEE Transactions on Magnetics, vol. 27, No. 6, Nov. 1991.
Roy D. Cideciyan et al., "A PRML system for digital magnetic recording", IEEE Journal on Selected Areas in Communication, vol. 10, No. 1, Jan. 1992.
E. Eleftheriou et al., "Noise-predictive maximum-likelihood (NPML) detection for the magnetic recording channel", IEEE 1996.
Jonathan D. Coker et al., "Noise-Predictive Maximum Likelihood (NPML) Detection", IEEE Transactions on Magnetics, vol. 34, No. 1, Jan. 1998.

(Continued)

Primary Examiner—Howard L. Williams
(74) Attorney, Agent, or Firm—Townsend and Townsend and Crew LLP; Patrick Duncan

(57) ABSTRACT

Techniques are provided for applying modulation constraints to data streams divided into separate interleaved portions. The even and odd bits in a data stream are separated into two data paths. A first modulation encoder encodes the even bits according to a first constraint. A second modulation encoder encodes the odd bits according to a second constraint. The two encoded data streams are then interleaved to form one data stream. The modulation encoders can encode the two data paths using Fibonacci encoding.

16 Claims, 1 Drawing Sheet

OTHER PUBLICATIONS

Jaekyun Moon et al., "Maximum Transition Run Codes for Data Storage Systems", IEEE Transactions on Magnetics, vol. 32, No. 5, Sep. 1996.

Roy D. Cideciyan et al., "Maximum Transition Run Codes for Generalized Partial Response Channels", IEEE Journal on Selected Areas in Communications, vol. 19, No. 4, Apr. 2001.

Kees A. Schouhamer Immink et al., "Codes for Digital Recorders", IEEE Transactions on Information Theory, vol. 44, No. 6, Oct. 1998.

"Circuitry for Performing Error Correction Calculations on Baseband Encoded Data to Eliminate Error Propagation", IBM Technical Disclosure Bulletin, Mar. 1981, Bliss, W.G.

M. Mansuripur, "Enumerative Modulation Coding with Arbitray Constraints and Post-Modulation Error Correction Coding for Data Storage Systems", SPIE vol. 1499 Optical Data Storage, 1991.

Adriaan J. van Wijngaarden et al., "Efficient Error Control Schemes for Modulation and Synchronization Codes", IEEE 1998.

Adriaan J. van Wijngaarden et al., "Maximum Runlength-Limited Codes with Error Control Capabilities", IEEE Journal on Selected Areas in Communications, vol. 19, No. 4, Apr. 2001.

William H. Kautz, "Fibonacci Codes for Synchronization Control", IEEE Transactions on Information Theory, Apr. 1965.

Kees A. Schouhamer Immink, "A Practical Method for Approaching the Channel Capacity of Constrained Channels", IEEE Transactions on Information Theory, vol. 43, No. 5, Sep. 1997.

Thomas M. Cover, "Enumerative Source Encoding", IEEE Transactions on Information Theory, vol. IT-19, No. 1, Jan. 1973.

Jorge Campello de Souza et al., "Constrained Systems with Unconstrained Positions", IEEE Transactions on Information Theory, vol. 48, No. 4, Apr. 2002.

D.T. Tang et al., "Block Codes for a Class of Constrained Noiseless Channels ", Information and Control 17, 1970, month unknown.

\* cited by examiner

TECHNIQUES FOR USING INTERLEAVED ENCODERS TO OBTAIN MODULATION CONSTRAINTS

BACKGROUND OF THE INVENTION

The present invention relates to techniques for applying modulation constraints to interleaved data, and more particularly, to techniques for applying modulation constraints separately to even and odd bits in a data stream.

A disk drive can write data bits onto a data storage disk such as a magnetic hard disk. The disk drive can also read data bits that have been stored on a data disk. Certain sequences of data bits are difficult to write onto a disk and often cause errors during read-back of the data.

Long recorded data sequences of the same polarity are examples of data bit patterns that are prone to errors. These data sequences correspond to long sequences of binary zeros or binary ones in the NRZ (non return-to-zero) representation, or alternatively to long sequences of binary zeros in the NRZI or PR4 representations. Another example of error prone data bit patterns are long sequences of zeros in alternating positions (e.g., 0a0b0c0d0 . . . , where a, b, c, d may each be 0 or 1) in the PR4 representation Binary sequences are routinely transformed from one representation to another using precoders and inverse precoders, according to well known techniques. In the present application, binary sequences are represented as PR4 sequences unless otherwise stated. A PR4 representation can be transformed into an NRZI representation by a precoder which convolves with $1/(1+D)$ or into an NRZ representation by a precoder which convolves with $1/(1+D^2)$.

It is desirable to eliminate error prone bit sequences in user input data. Eliminating error prone bit sequences ensures reliable operation of the detector and timing loops in a disk drive system. One way to eliminate error prone bit sequences is to substitute the error prone bit sequences with non-error prone bit patterns that are stored in memory in lookup tables. Lookup tables, however, are undesirable for performing substitutions of very long bit sequences, because they require a large amount of memory.

Many disk drives have a modulation encoder. A modulation encoder uses modulation codes to eliminate sequences of bits that are prone to errors.

Maximum transition run (MTR) constrained codes are one specific type of modulation code that are used in conjunction with a $1/(1+D)$ precoder. With respect to MTR codes, a j constraint refers to the maximum number of consecutive ones in an NRZI representation, a k constraint refers to the maximum number of consecutive zeros in an NRZI representation, and a t constraint refers to the maximum number of consecutive pairs of bits of the same value in an NRZI representation (e.g., AABBCCDDEE . . . ).

Codes that constrain the longest run of zero digits in the PR4 representation of a sequence are said to enforce a G-constraint where G is the longest allowed run of consecutive zeros. A G constrained PR4 representation is mapped to a k-constrained NRZI representation by a $1/(1+D)$ precoder, where k=G+1.

Codes that constrain the longest run of zero digits in alternate locations in the PR4 representation of a sequence are said to enforce an I-constraint, where I is the longest run of zeros in consecutive odd or even locations. An I-constrained sequence is necessarily G-constrained with G=2I. An I constrained PR4 representation is mapped to a t-constrained NRZI representation by a $1/(1+D)$ precoder, where t=I.

Fibonacci codes are one example of modulation codes that are used by modulation encoders. Fibonacci codes provide an efficient way to impose modulation code constraints on recorded data to eliminate error prone bit sequences. A Fibonacci encoder maps an input number to an equivalent number representation in a Fibonacci base. A Fibonacci encoder maps an input vector with K bits to an output vector with N bits. A Fibonacci encoder uses a base with N vectors, which is stored as an N×K binary matrix. Successive application of Euclid's algorithm to the input vector with respect to the stored base gives an encoded vector of length N.

Fibonacci codes are naturally constructed to eliminate long runs of consecutive one digits. This is expressed in the literature as the j constraint, where the parameter j enumerates the longest permitted run of ones. A trivial modification of the Fibonacci code is formed by inverting the encoded sequence. This inverted Fibonacci code eliminates long runs of consecutive zero digits. This constraint is expressed in the literature variously as the k constraint or G constraint, where the parameter k (or G) enumerates the longest permitted run of zeros. Fibonacci codes do not naturally enforce I constraints nor a combination of G and I constraints.

It would therefore be desirable to extend the Fibonacci codes construction to encompass combined G and I constraints.

BRIEF SUMMARY OF THE INVENTION

The present invention provides techniques for applying modulation constraints to data streams divided into two separate interleaved portions. Initially, the even and odd bits in a data stream are separated into two data paths. A first modulation encoder encodes the even bits according to a modulation constraint for even bits. A second modulation encoder encodes the odd bits according to a modulation constraint for odd bits, which in general coincides with the modulation constraint for even bits. The two encoded data streams can be interleaved to form one data stream. According to one embodiment of the present invention, the modulation encoders encode the even and odd bits using Fibonacci encoding.

In a preferred embodiment, odd and even sequences are encoded separately using a pair of Fibonacci encoders which enforce a G-constraint. The resulting interleaved data sequence satisfies both G and I constraints.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
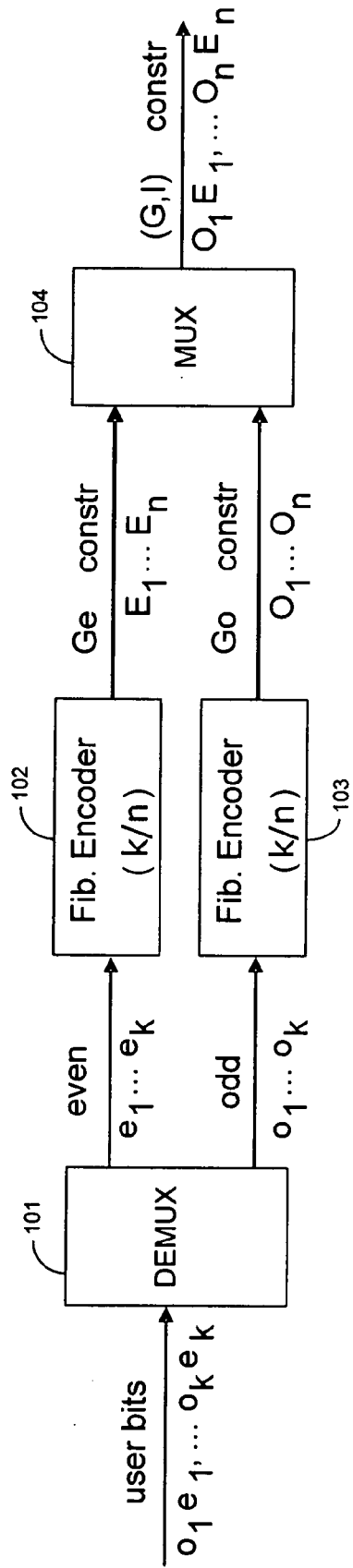
FIG. 1A illustrates a modulation encoding scheme that applies modulation constraints to even and odd bits separately, according to an embodiment of the present invention.

FIG. 1A illustrates an embodiment of a modulation encoder that applies modulation constraints to an interleaved set of data. The modulation encoder of FIG. 1A (as well as the modulation encoder of FIG. 1B) can eliminate sequences of alternating zeros in user data.

The modulation encoder of FIG. 1A has a demultiplexer 101 that separates out the even and odd bits in the user input data. For example, the first, third, fifth, seventh, ninth, eleventh, etc. bits can be designated as the odd bits, and the second, fourth, sixth, eighth, tenth, etc. bits can be designated as the even bits. The odd bits are represented as $o_1 \ldots o_k$, and the even bits are represented as $e_1 \ldots e_k$.

Fibonacci encoder 102 encodes the even bits $e_1 \ldots e_k$, and Fibonacci encoder 103 encodes the odd bits $o_1 \ldots o_k$. Fibonacci encoder 102 applies a global modulation constraint Ge to the even bits, and Fibonacci encoder 103 applies a global modulation constraint Go to the odd bits. Normally, Go=Ge. Fibonacci encoders 102 and 103 encode the input bits to impose a maximum number of consecutive 0s by converting the k incoming data bits in each interleaved level into N encoded bits using a Fibonacci base conversion technique.

Each encoder 102/103 receives an unconstrained input number that has k bits and generates a constrained output number that has n bits. Encoder 102 converts unconstrained even bits $e_1 \ldots e_k$ into constrained even bits $E_1 \ldots E_n$. Encoder 103 converts unconstrained even bits $o_1 \ldots o_k$ into constrained even bits $O_1 \ldots O_n$.

Global constraints Ge and Go may be different constraints or the same constraint. For example, encoder 102 can limit the even bit input number to having no more than 5 consecutive zeros, while at the same time, encoder 103 can limit the odd bit input number to having no more than 4 consecutive zeros. Alternatively, the even and odds bit input numbers can both be limited to no more than 4 consecutive zeros.

Multiplexer 104 interleaves the constrained even bits $E_1 \ldots E_n$ and the constrained odd bits $O_1 \ldots O_n$ to generate the interleaved constrained output data $O_1, E_1, \ldots O_n, E_n$. The output data of multiplexer 104 is constrained according to formulae G=2×Ge, if Ge=Go; or G=1+2×min(Ge, Go), if Ge≠Go. For example, if Ge=4 and Go=6, then G=9.

The output data of multiplexer 104 is also constrained according to the formula I=max (Ge, Go). This formula means that the maximum number of alternating zeros in the interleaved output data equals the greater constraint applied to the even or the odd bits. For example, if Ge=4 and Go=6, then I=6.

Figure 1B:
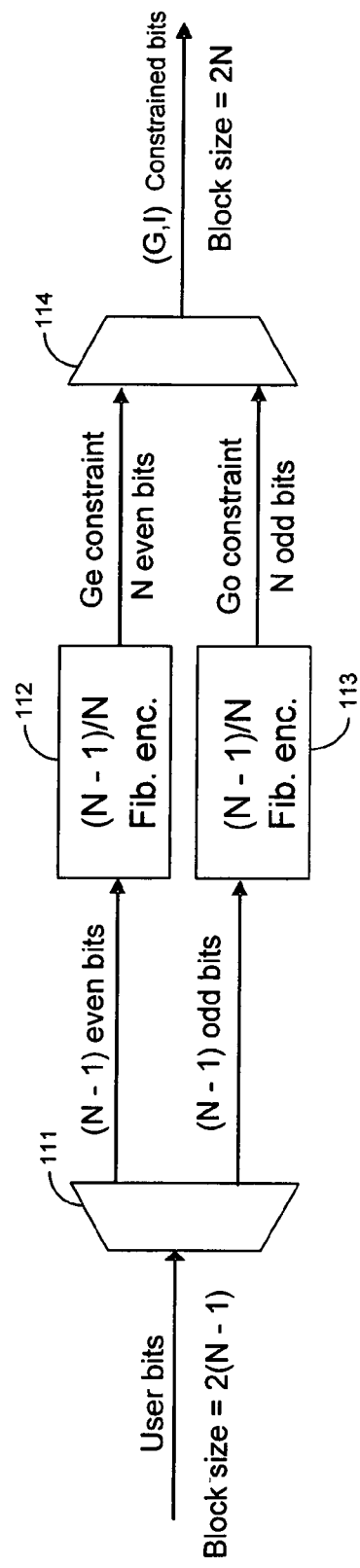
FIG. 1B illustrates a specific example of the modulation encoding scheme shown in FIG. 1A.

FIG. 1B illustrates a specific example of the generalized modulation encoder shown in FIG. 1A. Demultiplexer 111 separates the user data bits into the even and odd bits, as discussed above. Fibonacci encoder 112 encodes an (N−1)-bit vector corresponding to the even bits into an N-bit vector using a Fibonacci base, while Fibonacci encoder 113 does the same with the (N−1) odd bits. Fibonacci encoder 112 forces a constraint of Ge to the input even bits, while Fibonacci encoder 113 forces a constraint of Go to the input odd bits, as with the generalized embodiment of FIG. 1A.

In the example shown in FIG. 1B, Fibonacci encoders 112 and 113 each covert an input number with N−1 bits into an output number with N bits, using well known Fibonacci encoding techniques. Fibonacci encoders 112 and 113 can convert input numbers with any number of bits into the Fibonacci base. For example, encoders 112 and 113 can convert input numbers that have 199 bits into output numbers that have 200 bits in the Fibonacci base. The modulation rate of each encoder 112 and 113 is (N−1)/N. The overall modulation rate of the code in FIG. 1B is 2(N−1)/2N=(N−1)/N.

Fibonacci encoders 112 and 113 each map N−1 input bits into N encoded bits. For example, Fibonacci encoders 112 and 113 can map 199 bits into 200 bits (N=200). A lookup table approach would require storing $2^{199}$ input vectors. Fibonacci codes solve this problem by storing 200 base vectors, that each have a length of 199.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A disk drive system comprising:
    a demultiplexer that separates even bits and odd bits in the data into two separate data paths;
    a first Fibonacci modulation encoder that encodes the even bits to generate constrained even bits;
    a second Fibonacci modulation encoder that encodes the odd bits to generate constrained odd bits; and
    a multiplexer that interleaves the constrained even bits and the constrained odd bits.

2. The disk drive system according to claim 1 wherein the first modulation encoder maps N−1 of the even bits to N constrained even bits, and the second modulation encoder maps N−1 of the odd bits to N constrained odd bits.

3. The disk drive system according to claim 1 wherein output data of the multiplexer has a constraint G that equals 2×Ge, if Ge=Go,
    wherein Ge is a constraint applied by the first modulation encoder to the even bits to generate the constrained even bits, and
    Go is a second constraint that the second modulation encoder applies to the odd bits to generate the constrained odd bits.

4. The disk drive system according to claim 3 wherein the constraint G equals 1+2×min(Ge, Go), if Ge≠Go.

5. The disk drive system of claim 1 wherein a data sequence outputted by the multiplexer satisfies G and I constraints.

6. The disk drive system of claim 1 wherein a modulation rate of a data sequence outputted by the multiplexer is (N−1)/N, with 2(N−1) representing the number of bits in the data.

7. A disk drive controller chipset comprising:
    a demultiplexer that separates even bits and odd bits in the data into two separate data paths;
    a first Fibonacci modulation encoder that maps N-bit vectors corresponding to the even bits to a first vector, wherein the first vector has no more than N constrained bits;
    a second Fibonacci modulation encoder that maps N-bit vectors corresponding to the odd bits to a second vector, wherein the second vector has no more than N constrained bits.

8. The disk drive controller chipset defined in claim 7 further comprising:
    a multiplexer that interleaves bits corresponding to the first and second vector.

9. The disk drive controller chipset of claim 8 wherein a data sequence outputted by the multiplexer satisfies G and I constraints.

10. The disk drive controller chipset of claim 8 wherein the modulation rate of a data sequence outputted by the multiplexer is (N−1)/N, with 2(N−1) representing the number of bits in the data.

11. A method for applying modulation constraints to data, the method comprising:
   separating even bits and odd bits in a codeword into two data paths;
   applying a first modulation constraint to the even bits to generate constrained even bits using Fibonacci codes;
   applying a second modulation constraint to the odd bits to generate constrained odd bits using Fibonacci codes; and
   interleaving the constrained even bits with the constrained odd bits.

12. The method according to claim 11 wherein applying the first modulation constraint to the even bits comprises mapping N−1 of the even bits to N constrained even bits, and applying the second modulation constraint to the odd bits comprises mapping N−1 of the odd bits to N constrained odd bits.

13. The method according to claim 12 wherein constrained interleaved even and odd bits have a constraint G that equals 2×Ge, if Ge=Go, and wherein Ge is the first modulation constraint, and Go is the second constraint.

14. The method according to claim 13 wherein the constraint G equals 1+2×min(Ge, Go), if Ge≠Go.

15. The method of claim 11 wherein a data sequence comprising constrained even bits and constrained odd bits which are interleaved together satisfies G and I constraints.

16. The method of claim 11 wherein the modulation rate of a data sequence comprising constrained even bits and constrained odd bits which are interleaved together is (N−1)/N, with 2(N−1) representing the number of bits in the codeword.

* * * * *